United States Patent [19]

Elings

[11] Patent Number: 4,999,494
[45] Date of Patent: Mar. 12, 1991

[54] SYSTEM FOR SCANNING LARGE SAMPLE AREAS WITH A SCANNING PROBE MICROSCOPE

[75] Inventor: Virgil B. Elings, Santa Barbara, Calif.

[73] Assignee: Digital Instruments, Inc., Goleta, Calif.

[21] Appl. No.: 405,660

[22] Filed: Sep. 11, 1989

[51] Int. Cl.⁵ .............................................. G21K 5/10
[52] U.S. Cl. .................................. 250/306; 250/307; 250/440.1; 250/442.1
[58] Field of Search ................... 250/306, 491.1, 442.1, 250/307, 310, 311, 440.1, 396 R, 396 ML; 310/328, 311, 331; 73/104, 105; 324/158 F, 158 P, 158 R; 350/96.1, 96.24, 96.25, 96.26, 96.29

[56] References Cited

U.S. PATENT DOCUMENTS

| | | | |
|---|---|---|---|
| 4,163,168 | 7/1979 | Ishikawa et al. | 250/442.1 |
| 4,762,996 | 8/1988 | Binning et al. | 250/306 |
| 4,785,177 | 11/1988 | Besocke | 250/306 |
| 4,798,989 | 1/1989 | Miyazaki et al. | 250/491.1 |
| 4,837,445 | 6/1989 | Nishioka et al. | 250/306 |

Primary Examiner—Jack I. Berman
Assistant Examiner—Kiet T. Nguyen
Attorney, Agent, or Firm—Charles H. Schwartz; Ellsworth R. Roston

[57] ABSTRACT

A scanning probe microscope head, which includes means for scanning a probe over a limited portion of a sample surface, includes a casing having feet resting on the sample surface and is moved by positioning means to different portions of the sample surface while the head slides across the sample surface. In one embodiment, a positioning arm is mounted on a carriage driven by a first feed screw, while a sample support is mounted for adjustment by a second feed screw perpendicular to the first. In a second embodiment, the arm is mounted on an X-Y stage adjusted by perpendicular feed screws. In another embodiment, the head rests on the support surface for the sample and slides along this surface as its position is adjusted. The positioning arm supports one or two magnets which magnetically couple the arm to the head casing. The casing is made of ferromagnetic material or nonmagnetic material with a ferromagnetic insert.

22 Claims, 3 Drawing Sheets

SYSTEM FOR SCANNING LARGE SAMPLE AREAS WITH A SCANNING PROBE MICROSCOPE

BACKGROUND OF THE INVENTION

1. Field of the Invention

The present invention relates to scanning tunneling microscopes and, more particularly, to a scanning tunneling microscope for scanning large sample areas.

2. Description of the Prior Art

A scanning tunneling microscope scans a tip across the surface of a sample to measure its topography and this tip must be about three or four atoms away from the surface in order for the instrument to function. Only when the tip is this close to the surface does tunneling current flow between the sample and the tip. Because of this severe requirement that the tip be very close to the surface in order to operate, a scanning tunneling microscope must be very rigid. If the device is not rigid, the tip may strike the surface during a scan and destroy the sharpness of the tip. For measuring large samples this becomes a problem. A scanning tunneling microscope which is large enough to scan a large sample will not be sufficiently rigid and will suffer from unacceptably large thermal drifts between the components. Other similar microscopes, such as the atomic force microscope or scanning thermal probe microscope, use similar technology. I will refer to all these microscopes generally as "scanning probe microscopes."

My U.S. application Ser. No. 206,091, filed June 13, 1988, discloses a scanning tunneling microscope which rests on large samples so that the rigidity between the microscope scanner and the sample remains intact, but this and other prior art scanning tunneling microscopes are restricted in their scanning range to a limited portion of the sample surface which is about 100×100 microns. There is a need, however, when investigating large surfaces such as hard disc surfaces, for a system for moving the scanning tunneling microscope relative to the sample so that different portions of the sample can be measured.

U.S. Pat. No. 4,798,989 is concerned with the problem of a limited scanning area in scanning tunneling microscopes. The scanning tunneling microscope is incorporated in a sample chamber of a scanning electron microscope. A base is movable in an X-Y plane by a sample position adjusting device made up of a pair of perpendicular feed screw mechanisms, and a sample moving mechanism is mounted on the base and fixed in any desired position in the X-Y plane by changing piezoelectric elements. In such a device, the probe moving mechanism and the sample must be miniature enough to be accommodated in the sample chamber of a scanning electron microscope. Moreover, the scanning tunneling microscope is supported above the sample and does not rest on the sample with a resulting loss of rigidity.

SUMMARY OF THE INVENTION

The system of the present invention permits very large scans to be made over a sample with a scanning probe microscope which has the rigidity of a small microscope. A piezo electric scanner effects the scanning of the probe; and another positioning device moves the entire scanning device (the scanning probe microscope head) across the sample with the head remaining in contact with the surface of the sample, or with the surface of a sample support, as it is moved across the sample.

According to a first embodiment of the invention, a scanning probe microscope head, which is capable of scanning only a limited portion of a sample surface, includes a casing for housing means for scanning the probe and feet on the casing for resting the head on the sample surface. Positioning means moves the head to other portions of the sample surface while the head is resting on the sample surface, thereby maintaining the rigidity of a small scanning probe microscope. The positioning means includes an arm having magnetic means coupling the arm to the head casing by magnetic attraction. Two permanent magnets are mounted at spaced points at the end of the arm and are brought in contact with the casing which may be formed entirely of ferromagnetic material or formed of a nonmagnetic material with one or more ferromagnetic inserts.

The arm is mounted on a carriage which is moved in a first direction by a first feed screw mechanism, while the sample support is driven by a second feed screw mechanism perpendicular to the first feed screw mechanism. Alternatively, the carriage is driven by a typical X-Y stage comprising perpendicular feed screw mechanisms.

In an another embodiment of the invention, the head rests on the rigid surface of the sample support, rather than on the sample itself, and slides along the support surface as the microscope is moved to different portions of the sample.

In an additional embodiment, two separate arms are used, each with one magnet engaged with the head casing. Each arm is adjusted by a feed screw mechanism, one perpendicular to the other. The head is moved non-rectilinearly. When one arm is adjusted, the head pivots about the magnet on the other arm and visa versa.

While in all of the aforementioned embodiments the head may be rotated to any orientation relative to the arm, in yet another embodiment a groove is provided on the casing to receive a magnet mounted on the arm so that the orientation of the head may be fixed.

BRIEF DESCRIPTION OF THE DRAWINGS

These and other objects, features and advantages of the invention will become more apparent from the following detailed description taken with the accompanying drawings in which.

DETAILED DESCRIPTION OF THE PREFERRED EMBODIMENTS

Figure 1:
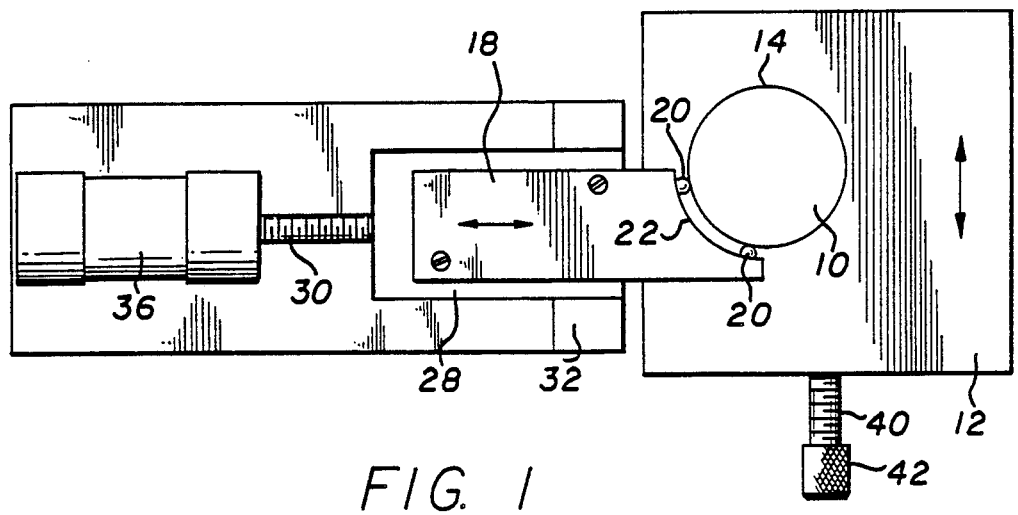
FIG. 1 is a plan view of a first embodiment of the invention.
Figure 2:
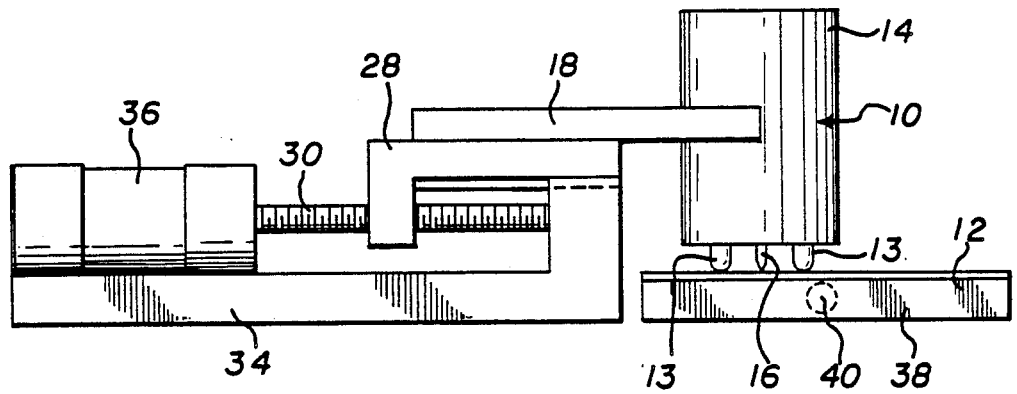
FIG. 2 is a side elevation view of the embodiment of FIG. 1.
Figure 3:
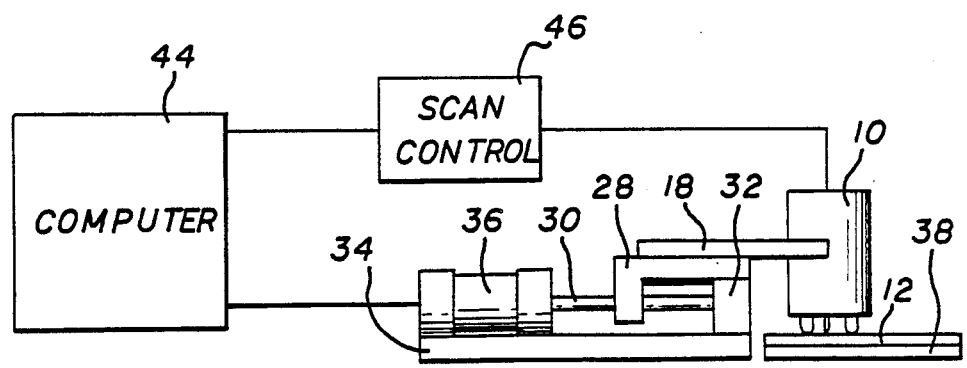
FIG. 3 is, in part, a block diagram illustrating the control of the embodiment of FIG. 1.

FIGS. 1-3 show a preferred embodiment of the invention. A scanning probe microscope head 10 is shown positioned over a large sample 12. Head 10 includes a casing 14 which encloses piezo scanning means for moving scanning probe 16 over a limited portion of sample 12. Feet 13, the ends of which are formed by ball bearings secured in place by magnets as shown in application Ser. No. 206,091, filed June 13, 1988, extend from the casing 14 enabling head 10 to rest on sample surface 12. As explained more fully in application Ser. No. 206,091, filed June 13, 1988, the scanning means moves tip 16 over an X-Y scanning pattern and also controls the position of tip 16 in the Z direction—that is, toward and away from the surface of sample 12. A feedback loop adjusts the vertical position of the tip.

Figure 7:
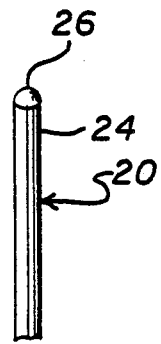
FIG. 7 is a perspective view of a magnet used in the invention.

According to the present invention, the position of head 10 over sample 12 is changed by positioning means including arm 18. A pair of magnets 20 are mounted in a surface 22 facing head casing 14. As shown in FIG. 7, magnets 20 include a main cylindrical permanent magnet portion 24 and have an end 26 formed of a half steel ball which is ferromagnetic and acts as an extension of magnet 24. Arm 18 is preferably formed of aluminum. While a ferromagnetic arm could be used, it would reduce the magnetic field at the end of the magnet.

Casing 14 may be formed wholly of ferromagnetic material. The casing will therefore be coupled to arm 18 by the magnetic attraction between magnets 20 and casing 14. This magnetic attachment of the arm to the casing is preferred, because it provides strong horizontal coupling forces. However, the head is able to slide up and down the magnets vertically, and the magnets apply no significant vertical forces on the head. The rigidity between the head and the sample is formed by the feet that rest on the sample, and it has been found that the magnetic attachment of arm 18 to the side of casing 14 does not degrade the performance of the microscope.

Arm 18 is bolted to a carriage 28 which is driven by feed screw 30, journaled, at one end, in a wall 32 of a fixed base 34. The other end of feed screw 30 is rotated by an electrical motor 36 mounted on base 34. A stepper motor of the type commonly found in disk drives will be suitable.

Sample 12 is mounted on a sample support 38. A second feed, or micrometer, screw 40, which is perpendicular to feed screw 30, moves support 38 in a direction perpendicular to the movement imparted by feed screw 30. The stage 38 could be a simple translation stage which moves on ways or rollers as screw 40 is adjusted using knob 42.

As feed screws 30 and 40 are adjusted, head 10 is slid across sample 12, remaining in contact with the sample in order to maintain rigidity, but capable of movement to different parts of the sample. Distances of a least one centimeter or one inch can be covered. When compared to the 100 micron scan of the microscope, the range that can be covered is enormous. With a stepper motor connected on a ¼ inch, 80-thread per inch screw, head 10 can be moved across sample 12 in 0.4 micron steps. When taking backlash into account, the head can be moved and then brought back to the original position within a micron. This positioning accuracy is adequate in view of the 100 micron range of the scanning probe microscope.

While positioning the head, the probe can be kept near or on the surface by making sure that the rate at which head 10 is moved along sample 12 is slower than the rate at which the probe is scanned across the sample. As data is continuously being taken and the probe is being scanned back and forth with the scanner, the entire microscope head may be moved across the surface of the sample. As shown in FIG. 3, stepper motor 36 controlling the motion of the microscope across the sample could be controlled by the same computer 44, which through scan control 46, is controlling the scanning of microscope probe 16. Therefore, the computer could be programmed to form a large image from the frames scanned as head 10 is moved across the sample.

It is not necessary that the probe be scanning the sample all the time. It may, instead, be convenient to withdraw the probe while making very quick motions of the microscope across the sample. If, for example, one wanted to cover half a centimeter of distance quickly, the probe could be retracted by the piezo electric scanner, the head could be moved across the sample, and then the probe could be put back down into the scanning position by the piezo electric scanner so that scanning could be started again. The probe could also be lifted by lifting the entire head. For instance, a small motor can be built in the head for lowering one of the feet 13 to lift head 10. There could be two modes of operation: one as described above in which the scanning is continuous and the head is moved while the scanning occurs; or the scanning could be stopped, the probe retracted and the head moved across the sample, and then the probe put back down. On rough samples one might want to retract the probe in any case in order to make sure that it dosen't hit any large feature of the sample as the head is moved across the sample. This would be especially true for the scanning tunneling microscope where the tip is rigid and is very near the sample surface.

Figure 8:
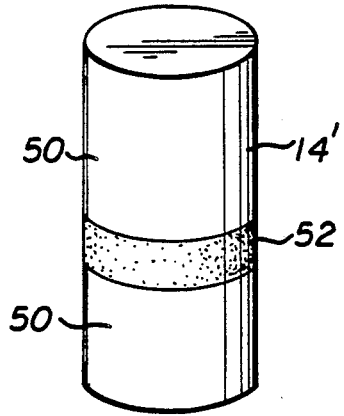
FIG. 8 is a perspective view of an embodiment of the head casing used in the invention.
Figure 9:
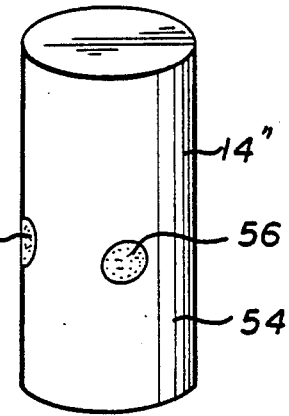
FIG. 9 is a perspective view of another embodiment of the head casing used in the invention.

The head casing does not need to be made entirely of ferromagnetic material. As seen in FIG. 8, the casing 14' could be made of nonmagnetic ceramic material 50 (reducing the weight of the head and providing greater stiffness) but with a ring 52 around the circumference which is ferromagnetic; or, as shown in FIG. 9, the casing 14" may be made of nonmagnetic ceramic material 54 with ferromagnetic inserts 56.

Figure 10:
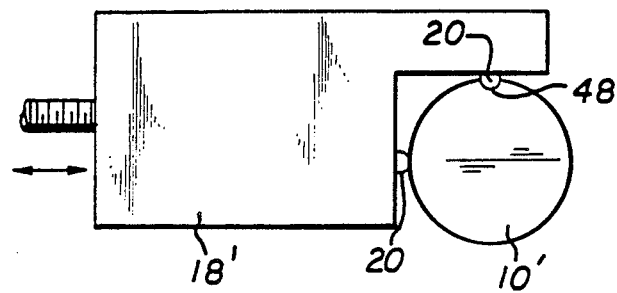
FIG. 10 is a partial plan view illustrating another embodiment of a system of the invention.

It is convenient to be able to rotate scanning head 10 with respect to arm 18. Since magnets 20 are attracted to scanning head 10 at no particular place, the orientation of the scanning of the probe and the XY scanning motion of the microscope don't need to be in any particular direction. Alternatively, as shown in the embodiment of FIG. 10, a vertical groove 48 in a microscope head 10' engages one of the magnets 20 so that the head 10' is always oriented in a particular direction with respect to the arm.

Figure 5:
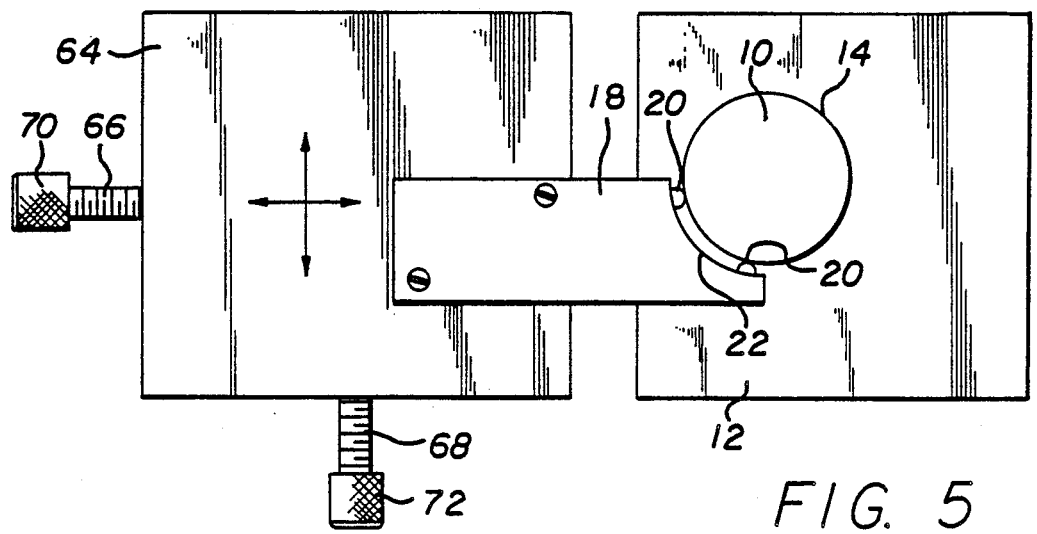
FIG. 5 is a plan view of a second embodiment of the invention.

The embodiment of FIG. 5 provides for a completely manual adjustment of head position. An X-Y stage 64 is adjusted in the X and Y directions respectively by manually adjusted feed, or micrometer, screws 66 and 68 by turning knobs 70 and 72. Arm 18 is bolted to the stage and, as in the embodiment of FIG. 1, is magnetically coupled to head casing 14 by means of magnets 20 mounted in the surface 22 of arm 18.

Figure 6:
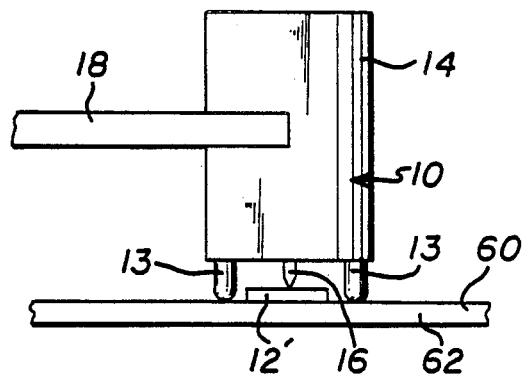
FIG. 6 is a partial side elevation view of another embodiment in which the scanning probe microscope rests on the surface of a sample support.

As illustrated by the embodiment of FIG. 6, the scanning probe microscope head 10 need not rest on the sample, but can be set on the flat support surface 60 of a sample holder 62. The sample 12' may, for example, be an integrated circuit. By moving arm 18 tip 16 is moved to different portions of the sample surface making it possible to collect many images from different portions of the sample as head 10 is moved. Instead of sliding on the sample itself, feet 13 slide across the surface 60 of sample holder 62 as head 10 is moved.

Figure 11:
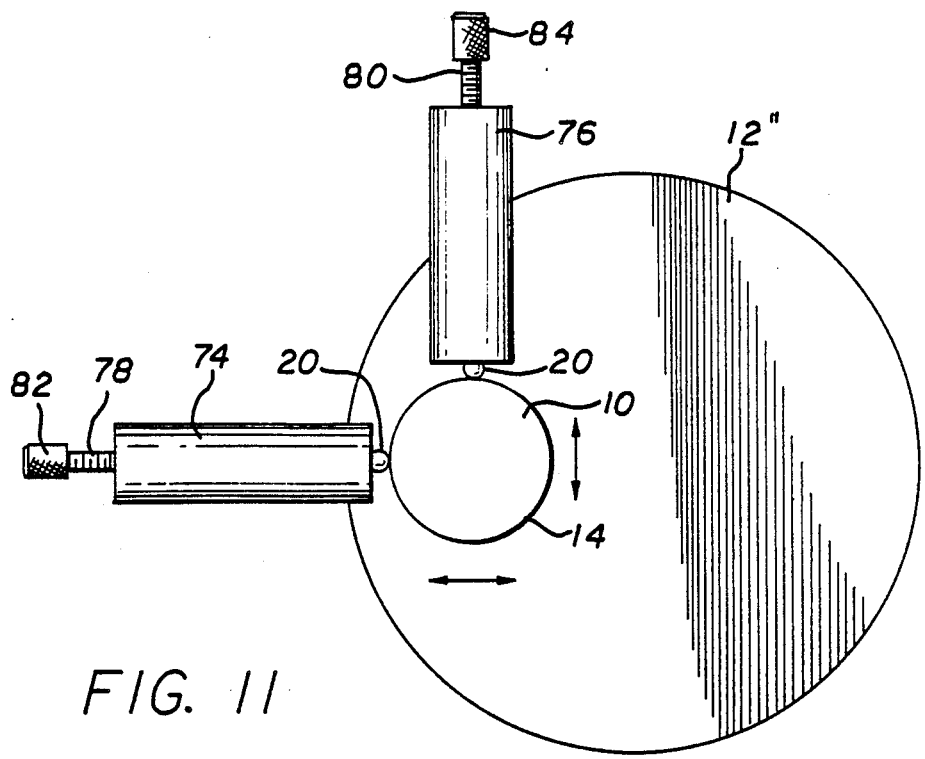
FIG. 11 is a plan view of yet another embodiment of a system of the invention.

In the embodiment of FIG. 11, head 10 is adjusted by two independently movable "one-dimensional" arms 74 and 76, linearly adjustable respectively by perpendicular manually adjusted feed, or micrometer, screws 78 and 80 by turning knobs 82 and 84. Each arm has a magnet 20 mounted in its end surface for contact with casing 14 of head 10. Thus, as arms 74 and/or 76 are manually adjusted, head 10 will slide across sample 12" to bring head 10 into position to scan different portions of the surface of sample 12". The head will not move in perpendicular directions when the arms are moved, because the head will rotate about the magnet 20 on the other arm when it is moved by one of the arms.

Figure 4:
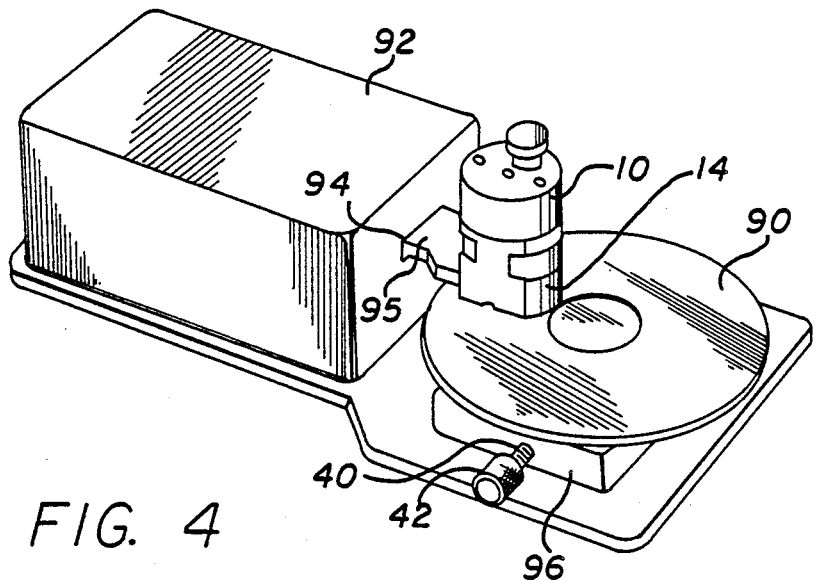
FIG. 4 is a perspective view of the embodiment of FIG. 1 inspecting a hard disc surface.

The perspective view of FIG. 4 shows the embodiment of FIG. 1 used to scan the surface of a hard disk 90. The motor, feed screw mechanism and carriage of FIG. 1 are within housing 92, and arm 95 extends out of slot 94. Sample 90 rests on sample holder 96 which is adjusted by turning knob 42 on feed, or micrometer, screw 40. Magnets at the end of arm 95 couple the arm magnetically to casing 14. As arm 95 and holder 96 are adjusted, head 10, which rests on sample 90, slides across its surface to bring head in position to scan different portions of the sample surface.

Although the invention has been described with reference to particular embodiments, it is to be appreciated that various adaptations and modifications may be made. For example, while means have been shown for positioning the head, it is to be understood that only the sample holder might be adjusted in position relative to the position of the head. In either case, it is important that the head rest upon and slide over the sample surface or, as in one embodiment, rest upon and slide over the sample supporting surface of the sample holder.

The invention claimed is:

1. A system for scanning a sample surface, comprising:
    a scanning probe microscope head, including a probe, means for scanning said probe over a limited portion of said sample surface and for moving said probe in a direction perpendicular to said sample surface, a casing for housing said means for scanning said probe, and means on said casing for resting said head on a rigid surface positioning said probe above said sample surface; and
    mechanical positioning means for moving said head to other portions of said sample surface, said means including arm means coupled to said casing and means for moving said arm means to position said head to said other portions of said sample surface while said head is resting on said rigid surface.

2. The system of claim 1, wherein said rigid surface comprises a support surface of a sample holder, said sample resting on said support surface, and said head sliding on said support surface as said head is moved to said other portions.

3. The system of claim 1, wherein said rigid surface comprises said sample surface, said head sliding on said sample surface as said head is moved to said other portions.

4. The system of claim 1, wherein said means for coupling said arm to said casing comprises magnetic means for coupling said arm to said casing by magnetic attraction.

5. The system of claim 4, wherein said casing is formed of ferromagnetic material and said magnetic means comprises at least one magnet supported on said arm means, said magnet being in contact with said casing.

6. The system of claim 4, wherein said casing is formed of nonmagnetic material with a ferromagnetic insert and said magnetic means comprises at least one magnet supported on said arm means, said magnet being in contact with said insert.

7. The system of claim 4, wherein said means for coupling said arm means to said casing permits said head to move vertically while restraining horizontal movement thereof relative to said arm means.

8. The system of claim 4, wherein said casing comprises ferromagnetic material and said magnetic means comprising two spaced magnets, said magnets contacting spaced points on said casing.

9. The system of claim 8, wherein said head is rotatable relative to said magnets and arm means.

10. The system of claim 8, wherein said casing has a groove, one of said magnets being engagable in said groove to restrain said head from rotation relative to said magnets and said arm means.

11. The system of claim 1, wherein said means for moving said arm means comprises a feed screw and a carriage driven by said feed screw, said arm means being mounted on said carriage.

12. The system of claim 1 wherein said means for moving said arm means comprises a pair of perpendicular feed screws for moving said arm means in two perpendicular directions.

13. The system of claim 1, wherein said sample rests on a sample holder, wherein said positioning means comprises feed screw means for moving said sample holder in a first direction, and wherein said means for moving said arm means comprises a feed screw perpendicular to said first direction.

14. The system of claim 1, wherein said arm means comprises a first arm and a second arm, said means for moving said arm means comprising first drive means for moving said first arm in a first direction and second drive means for moving said second arm in a second direction perpendicular to said first direction.

15. The system of claim 14, wherein said means for coupling said arm means to said casing comprises magnetic means on each arm for coupling said arms to said casing by magnetic attraction, said head pivoting about said magnetic means on said first arm when said second arm is moved and pivoting about the magnetic means on said second arm when said first arm is moved.

16. A system for scanning a sample surface, comprising:
    a scanning probe microscope head, including a probe, means for scanning said probe over a limited portion of said sample surface and for moving said probe in a direction perpendicular to said sample surface, and a casing for housing said means for scanning said probe; and
    positioning means for moving said head to other portions of said sample surface, said means including arm means, magnetic means for coupling said arm means to said casing by magnetic attraction, and means for moving said arm means to position said head to said other portions of said sample surface.

17. The system of claim 16, wherein said casing is formed of ferromagnetic material and said magnetic means comprises at least one magnet supported on said arm means, said magnet being in contact with said casing.

18. The system of claim 16, wherein said casing is formed of nonmagnetic material with a ferromagnetic insert and said magnetic means comprises at least one magnet supported on said arm means, said magnet being in contact with said insert.

19. The system of claim 16, wherein said magnetic means for coupling said arm means to said casing permits said head to move vertically while restraining horizontal movement thereof relative to said arm means.

20. The system of claim 16, wherein said casing comprises ferromagnetic material and said magnetic means comprising two spaced magnets, said magnets contacting spaced points on said casing.

21. The system of claim 20, wherein said head is rotatable relative to said magnets and arm means.

22. The system of claim 20, wherein said casing has a groove, one of said magnets being engagable in said groove to restrain said head from rotation relative to said magnets and said arm means.

* * * * *